(12) United States Patent
Chen et al.

(10) Patent No.: US 7,568,058 B2
(45) Date of Patent: Jul. 28, 2009

(54) RATE MATCHING APPARATUS, SYSTEMS, AND METHODS

(75) Inventors: Inching Chen, Portland, OR (US); Anthony L. Chun, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 95 days.

(21) Appl. No.: 11/776,642

(22) Filed: Jul. 12, 2007

(65) Prior Publication Data

US 2008/0013495 A1 Jan. 17, 2008

Related U.S. Application Data

(62) Division of application No. 10/612,760, filed on Jun. 30, 2003, now Pat. No. 7,260,659.

(51) Int. Cl.
*G06F 13/12* (2006.01)
*H04B 7/216* (2006.01)
*H04B 1/00* (2006.01)
*H03M 13/03* (2006.01)

(52) U.S. Cl. .................. 710/62; 370/335; 370/342; 375/145; 375/149; 714/790

(58) Field of Classification Search .................. 710/62; 370/335, 342; 375/145, 149; 714/790
See application file for complete search history.

(56) References Cited

U.S. PATENT DOCUMENTS

| | | | |
|---|---|---|---|
| 5,416,787 A | 5/1995 | Kodama et al. | |
| 5,436,918 A | 7/1995 | Kato et al. | |
| 6,369,771 B1 | 4/2002 | Chiang et al. | |
| 6,397,367 B1 | 5/2002 | Park et al. | |
| 6,693,889 B1 * | 2/2004 | Abe et al. | 370/342 |
| 6,788,657 B1 | 9/2004 | Freiberg et al. | |
| 7,082,565 B1 | 7/2006 | Michel et al. | |
| 7,269,783 B2 * | 9/2007 | Barry et al. | 714/790 |
| 2002/0027956 A1 | 3/2002 | Lee et al. | |
| 2003/0091003 A1 | 5/2003 | Wang et al. | |
| 2003/0156659 A1 * | 8/2003 | Hanaoka et al. | 375/298 |
| 2004/0073864 A1 * | 4/2004 | Moulsley | 714/790 |
| 2004/0091067 A1 | 5/2004 | Ammer et al. | |
| 2004/0097215 A1 | 5/2004 | Abe et al. | |
| 2004/0221222 A1 | 11/2004 | Barry et al. | |
| 2004/0264418 A1 | 12/2004 | Chen et al. | |
| 2005/0141549 A1 | 6/2005 | Dottling et al. | |
| 2007/0266302 A1 * | 11/2007 | Barry et al. | 714/790 |

* cited by examiner

*Primary Examiner*—Niketa I Patel
*Assistant Examiner*—David E Martinez
(74) *Attorney, Agent, or Firm*—Schwegman, Lundberg & Woessner, P.A.

(57) ABSTRACT

An apparatus and a system, as well as a method and article, may operate to include repeating first data to provide first repeated data and deleting second repeated data to provide second data according to a programmed standard included in a first apparatus and selected from a plurality of reprogrammable standards.

15 Claims, 7 Drawing Sheets

RATE MATCHING APPARATUS, SYSTEMS, AND METHODS

DIVISIONAL APPLICATION

The present application is a divisional of application U.S. Ser. No. 10/612,760, filed on Jun. 30, 2003 now U.S. Pat. No. 7,260,659, which is incorporated herein by reference.

TECHNICAL FIELD

Various embodiments described herein relate generally to communicating information, including apparatus, systems, and methods used to encode and decode information according to various standards.

BACKGROUND INFORMATION

One goal of the communications industry is to provide constant (e.g., "always-on") voice and data access, especially to mobile users. However, as users move about a given geographic area, products in their possession may encounter the need to transmit and/or receive data according to more than one communications standard, such as those which exist with respect to Wide Area Networks (WANs), Wireless Local Area Networks (WLANs) and Wireless Personal Area Networks (WPANs). In addition, the user's device data rate may not equal an allotted channel data rate. Thus, in order to communicate the user's data over a given communications link, the user's device may need to adapt the device standards to the link standards, and the device data rate to the channel data rate via rate matching, that is, by increasing or decreasing the device data rate to match the channel data rate.

DETAILED DESCRIPTION

In many embodiments, a reconfigurable device capable of communicating information using one of several wireless standards and rates appropriate for the user's current environment can be provided. For example, assume the existence of a wireless communications link between two users: a first user (User 1) and a second user (User 2). When User 1 is transmitting data to User 2, the data from User 1's application may be formatted, forward error correction (FEC) encoded, modulated, and sent to User 2's receiver by User 1's transmitter. At User 2's receiver, the transmitted data may be demodulated, decoded, and passed on to User 2's application. The specific methods of information encoding/decoding and modulating/demodulating may be described according to various selected wireless standards, one or more of which may be used to configure the device in advance.

Each user's application (speech, video, text, file transfer, email, etc.) may employ a user data rate of Bu bits per second. The channel data rate Bc typically depends on available bandwidth resources, including modulation type, allowable spectrum bandwidth, unused time slots, spreading codes, the number of users accessing the system, etc. Thus, if Bu, the user's data rate, is not equal to Bc, the channel data rate, a user's device must adapt the user's data rate to the channel data rate via rate matching.

Rate matching may require either increasing or decreasing the user's data rate Bu to match the channel rate Bc. If the user's data rate Bu is less than the channel data rate Bc, then some information bits may be repeated in the transmitted bit stream. In order to recover the original information sequence, the receiver may then operate to delete the corresponding repeated bits. However, if the user's data rate Bu is greater than the channel data rate Bc, then some information bits may be deleted prior to transmission. The term "puncturing" can be used to describe deleting a bit in conjunction with FEC encoding. The receiver may then insert or "depuncture" the corresponding deleted bits.

Puncturing may involve a loss of quality since the deleted bits can be replaced with depunctured symbols or nulls at the receiver. A "null" may occur halfway between symbol decisions and corresponds to a "no decision." For example, if two possible symbol choices are $\{-1, +1\}$ a null may correspond to the value $\{0\}$. For a more detailed description of the theory of punctured codes, see "Error-Correction Coding for Digital Communications" by G. C. Clark, Jr. and J. B. Cain, published by Plenum Press, 1981.

For purposes of clarity, it will be assumed that the embodiments described herein which include rate matching elements may operate to either repeat bits or delete bits with respect to a given input signal, and not to simultaneously repeat and delete bits within the same block of data. However, this assumption should not be construed as limiting the disclosure. It should be noted that each embodiment including rate matching elements may also have the capability of repeating and deleting bits within a single data block.

The reader may also assume that receivers described herein and used to recover a transmitted bit stream may be endowed with advanced knowledge of the rate matching sequence used at the corresponding transmitter. Again, however, this assumption should not be construed as limiting the disclosure, and each of the embodiments described herein may include receivers that do not have prior knowledge of the rate matching sequence used at the corresponding transmitter.

Finally, it may be assumed for the purposes of the discussion herein that a rate matcher can either increase the user data rate or decrease the user data rate. In other words, the rate matchers described herein are described in two separate configurations: an Upsampling Rate Matcher (URM) that operates to increase the user data rate and a Downsampling Rate Matcher (DRM) that operates to decrease the user data rate. This assumption should not be used to limit the disclosure, however, since those of skill in the art will realize, after becoming familiar with the content of this disclosure, that combinations of a URM and DRM may be implemented (e.g., as a single programmed device) to both raise and lower the user data rate, as desired.

Various communication standards require different specific methods of rate matching. However, most standards can be accommodated using two types of rate matching: state machine-based rate matching, and table-based rate matching. For state machine-based rate matching, a rule (e.g., "the transmitter deletes every 3rd bit" or "the transmitter repeats every fifth bit") can be used to describe the method. In these cases, rate matching is rule-based and may be implemented using a state machine.

For example, according to the IEEE 802.11a Wireless LAN standard, a punctured convolutional code may be used, such that the transmitter first encodes the user bits with a nonsystematic rate 1/2 encoder and then produces a rate 2/3 encoded bit stream by puncturing every fourth encoded bit, reducing the data rate by 25%. The rate matching rule in this case may be described as "delete every 4th bit." At the receiver, the received symbol stream can be depunctured by inserting a null symbol after every third received symbol prior to FEC decoding. For more information on the IEEE 802.11a standard, see "IEEE Standards for Information Technology— Draft Supplement to Telecommunications and Information Exchange between Systems—Local and Metropolitan Area Network—Specific Requirements—Part 11: Wireless LAN Medium Access Control (MAC) and Physical Layer (PHY) Specifications: High Speed Physical Layer in the 5 GHz Band," IEEE P802.11a/D5.0, 1999.

For some standards, rate matching methods cannot be compactly described using an algorithm or rule, and instead may be more easily defined as a list of bits to be deleted (e.g., "if D bits out of a total of N bits are to be deleted, then delete bits with indices i0, i1, i2, ..., iD−1"). In these cases, rate matching may be implemented using a lookup table (LUT).

One standard that may be implemented using a LUT includes portions of the European Telecommunications Standards Institute (ETSI) General Packet Radio System (GPRS) cellular standard. For more information on the details of this standard, please refer to ETSI Technical Specification (TS) 03.60 "General Packet Radio Service (GPRS) Service Description; Stage 2", Version 7.9.0, and later versions.

For example, considering a possible implementation of the TCH/AFS 7.4 speech channel (e.g., see the ETSI deliverable "Digital Cellular Telecommunications System" (Phase 2+) Global System Mobile (GSM), Channel Coding $3^{rd}$ Generation Partnership Project (3GPP) TS 05.03, Version 8.6.0, Release 1999, and later versions), a transmitter may operate to generate 474 encoded bits and then delete 26 bits, such that 448 total bits are transmitted. A puncturing rule for this example is difficult to design; however, puncturing can be implemented using a lookup table that lists the puncturing locations {0, 355, ..., 472}. At the receiver, the received symbol stream may be depunctured by inserting null symbols at the locations {0, 355, ..., 472} corresponding to the deleted bits.

To accommodate various standards, including those amenable to state machine-based rate matching and table-based rate matching, a Reconfigurable Rate Matcher (RRM) that forms a portion of a reconfigurable radio may be provided. The RRM may be implemented in a number of ways, including the use of a programmable digital signal processor with access to programs for several standards, a multiplexer to switch between several dedicated hardware rate matchers, and reconfigurable logic programmed according to any one of several desired standards. Using this latter approach, such logic may take the form of random access memory (RAM) and standard digital logic components such as AND gates, OR gates and registers, as well as Look Up Table (LUT)-based Field Programmable Gate Arrays (FPGAs) and Programmable Logic Devices (PLDs).

The use of reconfigurable logic, including FPGAs, PLDs, and other programmable logic, allows the RRM to be reprogrammed in-situ (e.g., in a deployed product) to accommodate multiple standards. For example, such logic may be reprogrammed via a configuration download whenever the associated radio changes wireless protocols. This means that one set of hardware can be reconfigured to process multiple standards, on-the-fly. This reconfigurable logic approach may require less area than that needed to implement a multiplexer-based, dedicated hardware solution. In addition, such an approach may consume less power than a DSP solution, while providing the same amount of programmability, enabling the addition of new features to existing hardware on an ad-hoc basis.

Given the wide variety of implementation possibilities, a specific example will be discussed herein to facilitate the understanding of various embodiments. However, this method of disclosure should not be taken as limiting the scope of the embodiments described; a more general implementation of several apparatus and systems will be provided thereafter.

Consider a RRM that can be configured to operate in two modes. First, as a State machine-based Rate Matcher (S-RM) for standards that can be represented using an algorithm. The state machine may then be implemented in programmable logic. Second, as a Table-based Rate Matcher (T-RM) for standards in which the rate matching can be implemented using a table. The table may then be implemented in RAM. While many rate matchers can be implemented as a T-RM, an S-RM may be preferred in high-speed applications because a state machine may be able to operate at higher data rates than a LUT.

Rate matching may be needed at both the transmitter and receiver. The receiver rate matcher may operate as the inverse of the transmitter rate matcher. Thus, if the transmitter rate matcher repeats bits prior to transmission in order to increase the user data rate, then the corresponding receiver rate matcher may operate to delete these bits. Alternatively, if the transmitter rate matcher deletes (punctures) bits prior to transmission in order to decrease the user data rate, then the corresponding receiver rate matcher may insert nulls (depunctures) in these locations.

Whether an S-RM or T-RM is used, a transmitter rate matcher may perform the following actions: transmit the current bit x(n) at time n, puncture or delete the current bit x(n) at time n (while transmitting the next bit x(n+1)), or repeat the previous bit x(n−1) at time n. The resulting bit stream may then be modulated and transmitted as a carrier wave to the receiver. The receiver may then downconvert the carrier wave to baseband, and demodulate the signal to provide either hard or soft decisions. Soft decisions (each symbol quantized to b bits) can improve the performance of some error correction decoding algorithms such as the Viterbi algorithm. These decisions can then be passed on to the receiver rate matcher.

Whether an S-RM or T-RM is used, the receiver rate matcher may perform the following actions: receive the current received symbol r(n) at time n, depuncture or insert a null symbol d(n) at time n, or delete the current received symbol r(n) at time n (while inserting the next symbol r(n+1)). The resulting symbol stream may then be sent to a follow-on processor, such as a FEC decoder.

Figure 1:
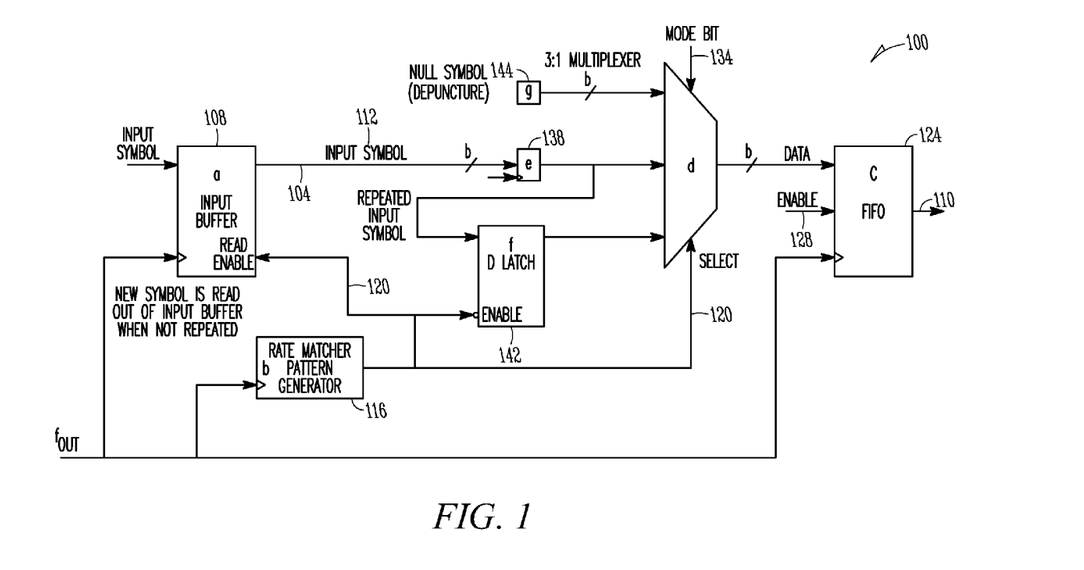
FIG. 1 is a schematic block diagram of an upsampling rate matcher according to various embodiments.

FIG. 1 is a schematic block diagram of an upsampling rate matcher (URM) 100 according to various embodiments. The URM 100, which may form part of an RRM, may operate to receive an input data stream 104 from an input buffer 108 at an effective frequency of $f_{in}$ bits per second, and to provide an output bit stream 110 at a rate of $f_{out}$ bits per second, where $f_{out} > f_{in}$. The effective data rate may be increased at the transmitter by repeating input bits, and at the receiver, by depuncturing symbols and inserting nulls of width b bits per symbol, where b is specified by the FEC decoder requirements. When the URM 100 is used at the transmitter, b=1.

Thus, as shown in FIG. 1, the URM 100 may include an input buffer 108 to store input bits (e.g., as symbols 112). The URM 100 may also include a Rate Matcher Pattern Generator (RMPG) 116 to produce the rate matcher bit pattern 120. The RMPG 116 may be implemented as a table or a state machine. As shown, if the rate matcher bit pattern 120 has a logic low value, a symbol may be depunctured or repeated.

The URM 100 may also include a first-in, first-out (FIFO) memory 124 to accept input data if the Enable signal 128 is high. The width of the FIFO memory 124 input and output bus may depend on whether the URM 100 is operating to repeat bits at the transmitter or to depuncture soft decision symbols at the receiver.

The URM 100 may also include a multiplexer 130 (e.g., a 3:1 multiplexer) to receive the input data stream 104 and to select between an input symbol, a depunctured symbol, or repeating an input symbol. The mode bit 134 may be used to determine whether the selection is between the input symbol and the depunctured symbol, or between the input symbol and repeating the input symbol. The RMPG 116 may provide one bit per clock cycle that controls the input selection of the multiplexer 130. The width of the multiplexer 130 input and output bus, as shown, is also b bits and may depend on whether the URM 100 is operating to repeat bits at the transmitter or to depuncture soft decision symbols at the receiver.

The URM 100 may also include a register 138 (e.g., a D register) to store the current input symbol, and a latch 142 (e.g., a D-latch) to store the input bit to be repeated. The URM 100 may also include a memory 144 (e.g., one or more bits, perhaps held in a register) to provide a constant depuncturing value, such as a null symbol.

The URM 100, as shown, may operate in two modes: Repeat Mode and Depuncture Mode. Thus, the same URM design can be used for both modes; a one bit mode bit 134 may be used to select between these modes.

The Repeat Mode can be used at the transmitter for repeating bits. In this mode, the mode bit 134 can be used to configure the multiplexer 130 to select between the current input bit and repeating the previous input bit. When the RMPG rate matcher bit pattern 120 (i.e., the multiplexer 130 Select signal) has a logic high value, the Enable signal of the input buffer 108 is also high and an input bit may be read from the input buffer 108 and loaded into the register 138. This rate matcher bit pattern 120 is also connected to the Enable input of the latch 142, such that when the input bit is output from the register 138 it can be loaded into the latch 142. The rate matcher bit pattern 120 can also be used to control the selection of the multiplexer 130, as well as to select the output of the register 138, which serves as the current input bit.

When the rate matcher bit pattern 120 has a logic low value, this indicates that an input bit can be repeated. The Enable input of the input buffer 108 is also low in this instance, and a new bit should not be read from the input buffer 108. Also, the Enable signal for the latch 142 will be low, meaning that a new bit should not be input into the latch 142. The multiplexer 130 then may operate to select the output of the latch 142 and the bit is repeated while the rate matcher bit pattern 120 has a logic low value. When the rate matcher bit pattern 120 again has a logic high value, the next input bit may be read from the input buffer 108 and sent to the FIFO memory 124. The memory 144 may not be needed for operation in the Repeat Mode.

The Depuncture Mode may be used at the receiver for depuncturing operations. In this mode, the mode bit 134 may be used to configure the multiplexer 130 to select between the input symbol and a depunctured symbol. The depunctured symbol may be selected as a constant b-bit value corresponding to a "no decision" value. When the rate matcher bit pattern 120 has a logic high value, the Enable signal at the input buffer 108 is also high and an input symbol may be read from the input buffer 108 and loaded into the register 138. The rate matcher bit pattern 120 can be used to control the selection of the multiplexer 130, and to select the output of the register 138, which is the current input symbol 112. When the rate matcher bit pattern 120 has a logic low value, this indicates that a depunctured symbol is to be inserted into the bit stream 104. The Enable signal on the input buffer 108 is also low in this instance, and a new symbol should not be read from the input buffer 108. The multiplexer 130 may then select the depunctured symbol, which may be sent to the FIFO memory 124. The latch 142 may not be used for operation in the Depuncture Mode.

Figure 2:
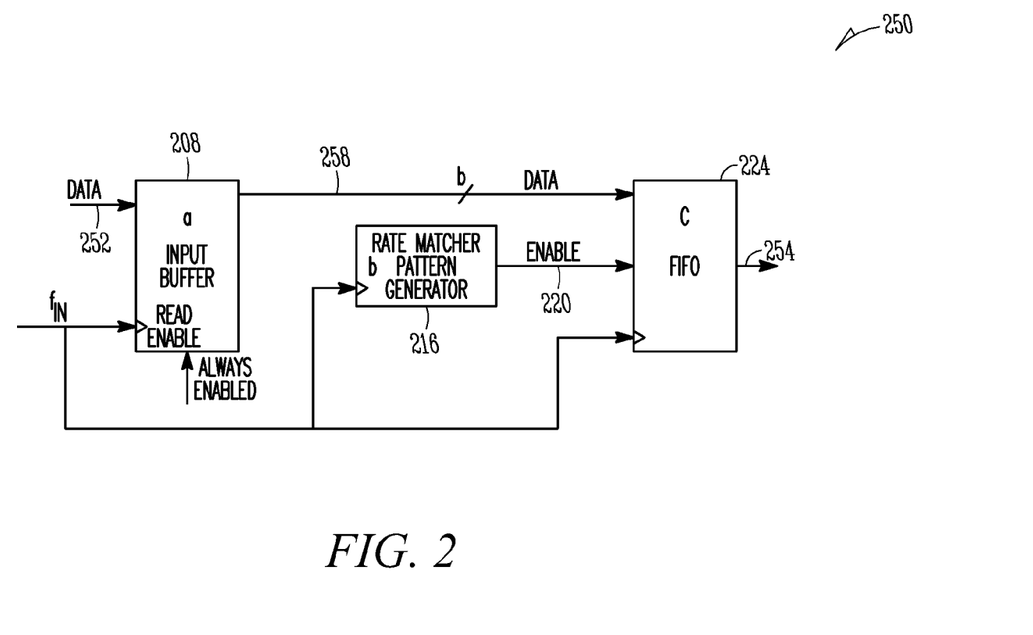
FIG. 2 is a schematic block diagram of a downsampling rate matcher according to various embodiments.

FIG. 2 is a schematic block diagram of a downsampling rate matcher (DRM) 250 according to various embodiments. The DRM 250, which may form part of an RRM, may operate to receive an input data stream 252 at a frequency $f_{in}$ bits per second, and to provide an output bit stream 254 at an effective rate of $f_{out}$ bits per second, where $f_{out}<f_{in}$. Thus, the user data rate may be decreased at the transmitter by puncturing bits, and at the receiver, by deleting repeated bits (e.g., symbols).

The DRM 250 may include an input buffer 208 to store input bits (e.g., symbols), as well as an RMPG 216 to provide a rate matcher bit pattern 220. The DRM may also comprise a FIFO memory 224 to receive the input data 258 from the input buffer 208 when the Enable signal of the FIFO memory 224 has a logic high value. The width of the FIFO memory input and output buses may depend on whether the DRM 250 is operating to delete bits at the transmitter, or to delete repeated soft decision symbols at the receiver.

The puncturing bit pattern (i.e., the rate matcher bit pattern 220) is provided by the RMPG 216. Depending upon the selected standard, the RMPG 216 may be implemented as either a state machine or a LUT. The RMPG 216 may provide one bit per clock cycle. Thus, as shown, if the rate matcher bit pattern 220 has a logic high value, the FIFO memory 224 may be enabled and the input symbol from the input buffer 208 may be sent to the FIFO memory 224. Otherwise, the input symbol should not be sent to the FIFO memory 224, such that it is effectively deleted or punctured.

Figure 3:
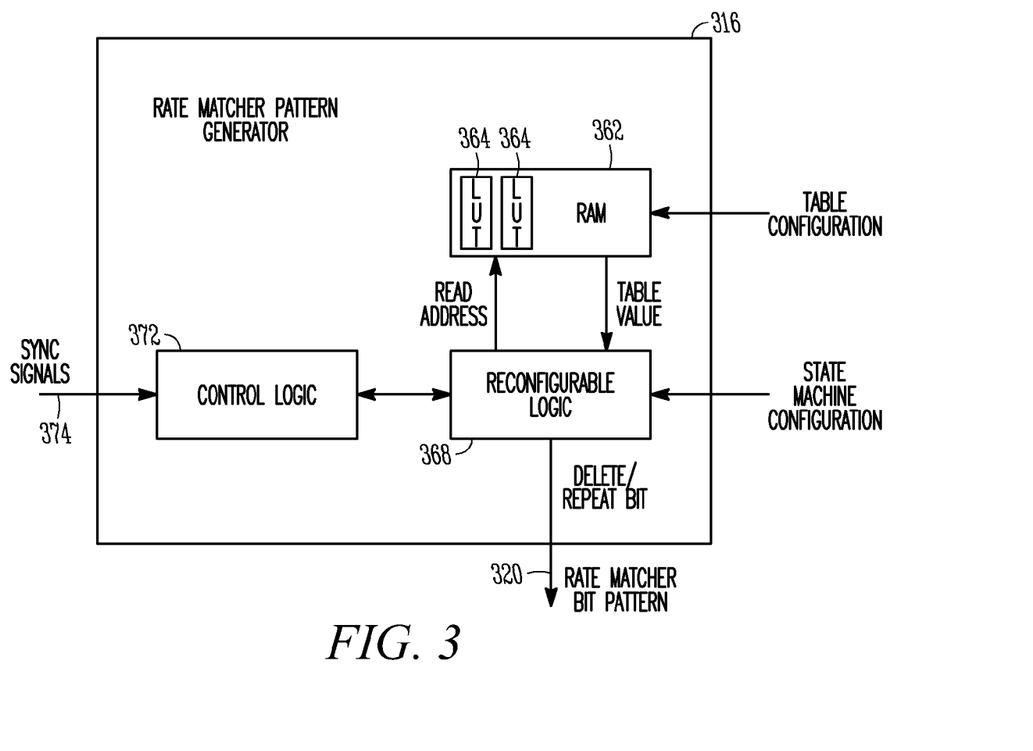
FIG. 3 is a schematic block diagram of a rate matcher pattern generator according to various embodiments.

FIG. 3 is a schematic block diagram of an RMPG 316 according to various embodiments. The RMPG 316, which may form part of an RRM, URM, or DRM, may include logic to implement a state machine for rule-based rate matching, and/or a look up table for table-based rate matching. The RMPG 316 may include a memory 362 (e.g., a RAM) to store one or more look up tables 364, for example, when the associated RRM is configured as a table-based rate matcher.

The RMPG 316 may also include reconfigurable logic 368 (e.g., FPGAs, PLDs, etc.) capable of implementing AND gates, OR gates and/or various types of registers. The reconfigurable logic 368 can be implemented in the form of look up tables, or directly, as discrete logic functions, or as a combination of these. The reconfigurable logic 368 may be designed to operate as a state machine when the associated RRM is configured as an S-RM, or as a modulo counter when the associated RRM is configured as a T-RM.

The RMPG 316 may include control logic 372 to synchronize the RMPG 316 with the associated input data stream (not shown in FIG. 3) so that the correct bits are inserted or deleted. The control logic 372 may use external synchronization signals 374 provided by various transmitter components (e.g., frame synchronization signals) to implement various synchronization tasks.

When the RMPG 316 is configured to include a state machine, the hardware used often depends on the complexity of the state machine to be implemented. The control logic 372 may be used to synchronize and reset the operations of the reconfigurable logic 368, operating as a state machine. In this configuration, the memory 362 may not be needed. When the RMPG 316 is configured to include a look up table, the size of the table may depend on the longest rate matcher bit pattern 320 to be provided. The memory 362 may include a puncture pattern. The reconfigurable logic 368 may also be used to implement a modulo counter with a period equal to the longest rate matcher bit pattern 320, controlling the deleting and repeating of bits.

The DRM and URM, as well as the RMPG can be configured to operate as a part of many different apparatus and systems, including an RRM. For example, referring to FIG. 2, the DRM 250 may be configured to implement IEEE 802.11a rate 2/3 code, described previously. In this case, the RMPG 216 may be configured as a two-bit down counter state machine that counts 3-2-1-0, where the value of "0" results in deleting every fourth bit. Thus, when the RMPG 216 provides the "0" value, the rate matcher bit pattern 220 has a low value, the Enable signal to the FIFO memory 224 is also low, and the input bit (i.e., data 258) is deleted.

In another example, the DRM 250 may be configured according to the requirements presented by a GPRS TCH/AFS 7.4 speech channel, mentioned above. In this case, referring to FIGS. 2 and 3, it can be seen that the RMPG 216 may be configured as a look up table and a 474-bit puncture pattern can be stored in the memory 362. The reconfigurable logic 368 may be configured as a modulo counter that cycles from 0 to 473 and generates the read addresses for the memory 362. A value of "0", provided by the reconfigurable logic 368, indicates that the bit is to be deleted.

In yet another example, referring to FIGS. 1 and 3, a URM 100 may be configured to increase the user data rate by a factor of 3 by inserting 2 bits after each input bit in the data stream 104. In this example, the reconfigurable logic 368 may be configured as a state machine having a three-state up counter that counts 0-1-2. When a counter value of "0" is provided by the reconfigurable logic 368, the input bit is output; when a counter value of "1" or "2" is provided, the previous input bit is repeated and reading of the input buffer 108 is prevented.

In some embodiments, the URM and the DRM can be combined to implement various protocols. For example, if it is desired to increase the transmitter data rate and to decrease the receiver data rate, the transmitter may use a URM to increase the user data rate Bu (i.e., $f_{in}$) to match the channel data rate Bc (i.e., $f_{out}$) by repeating input bits. The receiver may use a DRM to receive input symbols at the channel data rate Bc (i.e., $f_{in}$) by deleting the corresponding repeated soft decision symbols and providing a reduced symbol user data rate of Bu (i.e., $f_{out}$). The data width of the DRM may be equal to the number of soft decision bits required by the FEC decoder.

In another example, if it is desired to decrease the transmitter data rate and to increase the receiver data rate, the transmitter may use a DRM to decrease the user data rate Bu (i.e., $f_{in}$) so as to provide a channel data rate of Bc (i.e., $f_{out}$) by deleting (puncturing) bits. The receiver may use a URM to receive input symbols at the user data rate of Bc (i.e., $f_{in}$) by inserting depunctured soft decision symbols in the corresponding output data stream locations to increase the symbol user data rate to Bu (i.e., $f_{out}$). The data width of the URM may be equal to the number of soft decision bits required by the FEC decoder.

The implementation of a RRM does not rely on any single technology or method. However, reconfigurable logic and memory may be useful with respect to providing flexible realization of various embodiments. For example, a RRM may be implemented using a RAM combined with programmable logic such as a Programmable Logic Array (PLA) that provides various gate types (e.g., AND, OR, etc.) and register sets, such that the PLA may operate as a state machine by setting appropriate switches in the OR and AND planes.

Another RRM implementation may take advantage of RAM-based FPGAs. Using this approach, an FPGA RAM may be configured to form one or more look up tables to implement state machine logic functions, and/or as a memory to store tables for an included RMPG.

A RRM implemented according to various embodiments should be easily programmable. The programming method may depend on how the RRM is configured. For example, when an S-RM is included, the rate matcher may be programmed by downloading a bit sequence to configure the associated state machine. For example, in a PLA implementation, the bit sequence may be used to configure the AND/OR plane switches that define the state machine operation.

When a T-RM is included in the RRM, the rate matcher may be programmed by downloading M single bit entries into the memory to form one or more tables, and then configuring logic to operate as a modulo counter with a period of M. The state machine logic may be designed using Hardware Description Language (HDL).

Those of skill in the art, upon reading this disclosure and viewing the appended figures, will realize that many of the elements shown in FIGS. 1-3 can be re-used and/or combined in various embodiments for purposes of design economy. In addition, in some embodiments, the programming of RMPGs in the transmitter and receiver may be the same, simplifying design efforts.

Figure 4:
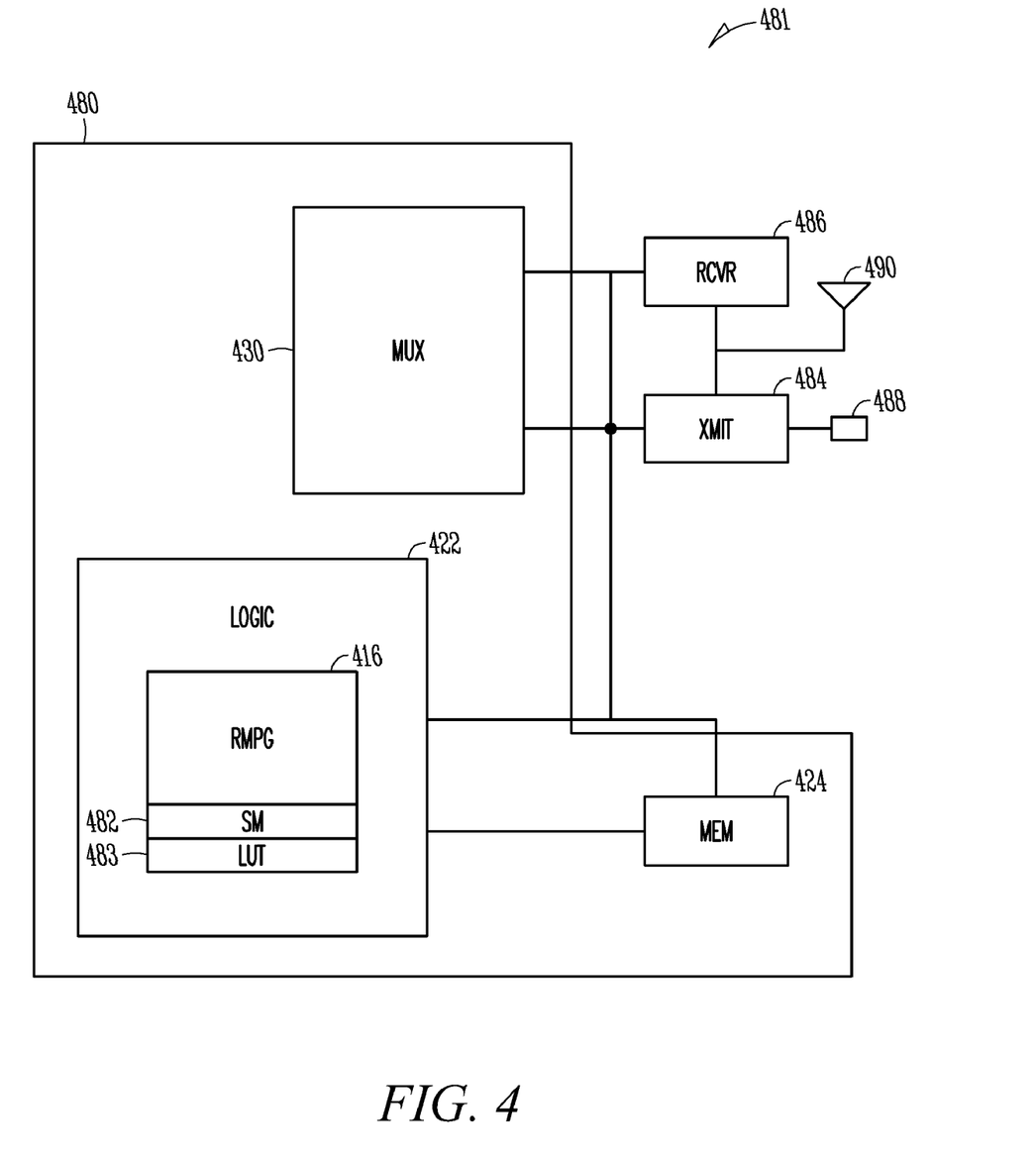
FIG. 4 is a block diagram of an apparatus and a system according to various embodiments.

Now that a number of specific examples have been described, and keeping in mind the possibility of combining various elements, a more general approach may be outlined. FIG. 4 is a block diagram of an apparatus 480 and a system 481 according to various embodiments. In this case, time multiplexing may permit the use of a single set of hardware for both transmitter and receiver rate matching. The apparatus 480, which may comprise an RRM, may include a RMPG 416 having at least one operational mode selectable between a repeat transmission mode and a depuncture reception mode. The RMPG 416 may also be configured to operate in a mode selectable between a delete reception mode and a puncture transmission mode. The RMPG 416 may be configured to include a state machine 482 to implement a rule-based standard, and/or configured to include a look up table 483 to implement a table-based standard.

In some embodiments, the apparatus 480 may also include a multiplexer 430 coupled to the RMPG 416 to select between input data and repeated data. In some embodiments, the multiplexer 430 may be used to select between input data and depunctured data.

The apparatus 480 may include a transmitter 484, such as a wireless transmitter, coupled to the multiplexer 430 to transmit repeated data, and a receiver 486, such as a wireless receiver, coupled to the multiplexer 430, to provide input data. The transmitter 484 may be used to transmit punctured data provided in the puncture transmission mode. The receiver 486 may be used to provide input data in the delete reception mode. The apparatus 480 may include a FIFO memory 424 coupled to the RMPG 416 and the transmitter 484. The FIFO memory 424 may be used to store punctured data.

Other embodiments may be realized. For example, as shown in FIG. 4, a system 481 may include reconfigurable logic 480, a transmitter 484 coupled to the reconfigurable logic 480 to repeat first data to provide first repeated data, and a receiver 486 coupled to the reconfigurable logic 480 to delete second repeated data to provide second data according to a programmed standard included in the reconfigurable logic 480 and selected from a plurality of reprogrammable standards, meaning a group of standards, of which one or more can be downloaded into or programmed into the apparatus or system, which may be programmable and/or reconfigurable. The system 481 may include reconfigurable logic 480 comprising a RMPG 416 configurable to operate in a mode selectable between a repeat transmission mode and a depuncture reception mode and/or to operate in a mode selectable between a delete reception mode and a puncture transmission mode.

The system 481 may operate in a wired or wireless environment. In a wireless environment, a wireless energy emission device 488 (e.g., an antenna, an optical source, an infrared light-emitting diode, etc.) may be coupled to the transmitter 484 in some embodiments. Alternatively, or in addition, the system 481 may include an antenna 490 (e.g., a monopole antenna, a dipole antenna, an omnidirectional antenna, etc.) coupled to the receiver 486 (and/or the transmitter 484). In some embodiments, the system 481 may also comprise reconfigurable logic 480, a transmitter 484 coupled to the reconfigurable logic 480 to puncture first data to transmit first punctured data, and a receiver 486 coupled to the reconfigurable logic to depuncture second punctured data to provide second data according to a programmed standard selected from a plurality of reprogrammable standards.

Figure 5:
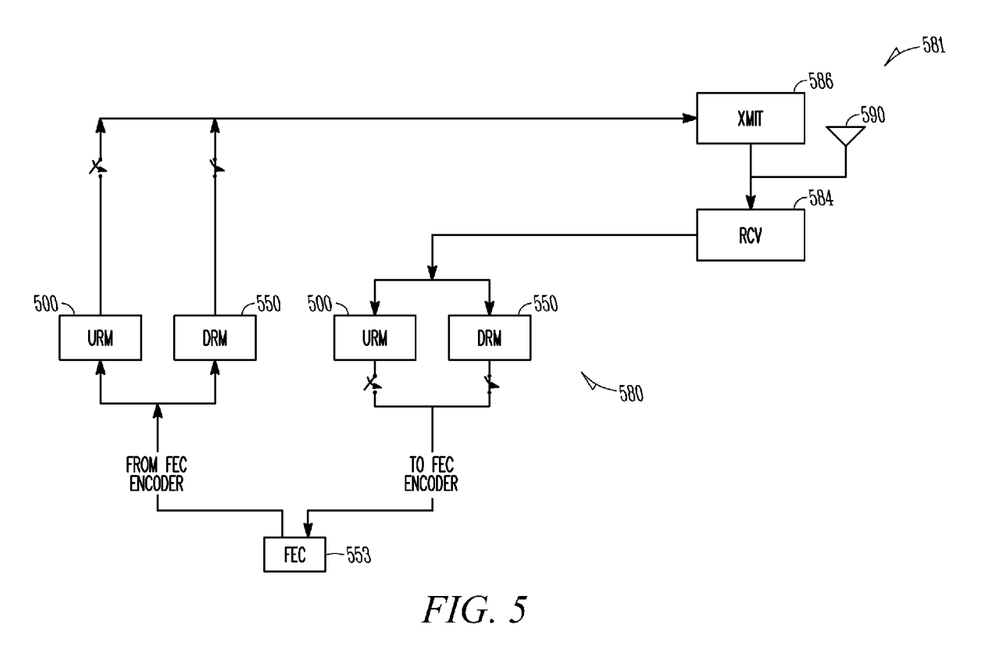
FIG. 5 is a block diagram of an apparatus and a system according to various embodiments.

FIG. 5 is a block diagram of an apparatus 580 and a system 581 according to various embodiments. In this case, rate matching may be implemented using spatial multiplexing, such that separate devices, including URMs 500, and DRMs 550, perhaps coupled to a FEC device 553 (which may include a FEC encoder and a FEC decoder) are used to implement rate matching for the receiver 584 and the transmitter 586, to be coupled to one or more antennas 590.

The URMs 100, 500, input data stream 104, input buffer 108, 208, output bit stream 110, symbols 112, RMPG 116, 216, 316, 416, rate matcher bit pattern 120, 220, FIFO memory 124, 224, Enable signal 128, multiplexer 130, 230, 430, mode bit 134, register 138, latch 142, memory 144, DRMs 250, 550, input data stream 252, FEC device 553, output bit stream 254, input data 258, memory 362, look up tables 364, reconfigurable logic 368, control logic 372, synchronization signals 374, apparatus 480, system 481, state machine 482, look up table 483, transmitters 484, 584, receivers 486, 586, wireless energy emission device 488, and antennas 490, 590 may all be characterized as "modules" herein. Such modules may include hardware circuitry, and/or one or more processors and/or memory circuits, software program modules, including objects and collections of objects, and/or firmware, and combinations thereof, as desired by the architect of the apparatus 480, 580 and the systems 481, 581, and as appropriate for particular implementations of various embodiments.

It should also be understood that the apparatus and systems of various embodiments can be used in applications other than for the wireless communication of information, and thus, various embodiments are not to be so limited. The illustrations of apparatus 480, 580 and systems 481, 581 are intended to provide a general understanding of the structure of various embodiments, and they are not intended to serve as a complete description of all the elements and features of apparatus and systems that might make use of the structures described herein.

Applications which may include the novel apparatus and systems of various embodiments include electronic circuitry used in high-speed computers, communication and signal processing circuitry, modems, processor modules, embedded processors, and application-specific modules, including multilayer, multi-chip modules. Such apparatus and systems may further be included as sub-components within a variety of electronic systems, such as televisions, cellular telephones, personal computers, workstations, radios, video players, vehicles, and others.

Figure 6:
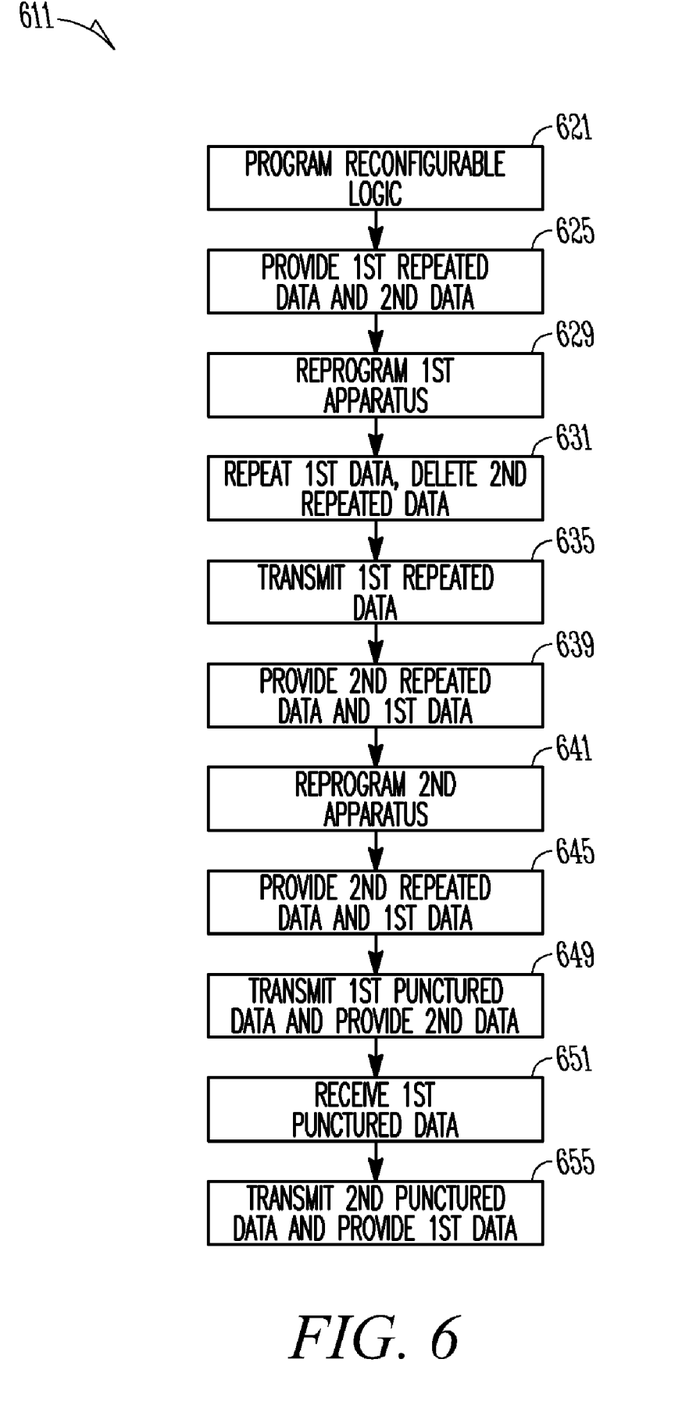
FIG. 6 is a flow chart illustrating several methods according to various embodiments.

Many other embodiments may be realized. For example, FIG. 6 is a flow chart illustrating several methods according to various embodiments. Consider a first apparatus communicating over a channel with a second apparatus. One or more standards may be included in each apparatus, and the reconfigurable logic in each apparatus may be programmed and reprogrammed any number of times, to accommodate any one or more of the included standards. The channel data rate $B_c$ may be greater or less than the user data rate $B_u$ for each apparatus.

Thus, the method 611 may (optionally) begin with programming the reconfigurable logic included in the first apparatus to include at least one programmed standard selected from a first plurality of reprogrammable standards at block 621. The method 611 may continue with repeating first data (to increase the user data rate for transmission) to provide first repeated data and deleting second repeated data (to decrease the channel data rate for reception) to provide second data according to the programmed standard at block 625.

The method 611 may include reprogramming the first apparatus to operate in accordance with a second plurality of reprogrammable standards (including the same programmed standard as the first plurality of standards) at block 629, and repeating the first data (for transmission) and deleting the second repeated data (for reception) according to the programmed standard at block 631.

The first apparatus may include reconfigurable logic having at least one of a state machine-based rate matcher and a table-based rate matcher, or at least one of each type of rate matcher. The method 611 may include transmitting, from the first apparatus, the first repeated data to a second apparatus, at block 635.

The method 611 may include repeating the second data (to increase the user data rate for transmission) to provide the second repeated data and deleting the first repeated data (to decrease the channel data rate for reception) to provide the first data according to the programmed standard selected from either the first or the second plurality of reprogrammable standards included in the second apparatus at block 639. The method 611 may also include reprogramming the second apparatus to operate in accordance with a third plurality of reprogrammable standards including the programmed standard (the same programmed standard included in the first and second pluralities of standards) at block 641, and repeating the second data (to increase the user data rate for transmission) to provide the second repeated data and deleting the first repeated data (to decrease the channel data rate for reception) to provide the first data according to the programmed standard selected from the third plurality of reprogrammable standards at block 645.

Other embodiments may also be realized. For example, the method 611 may include puncturing first data (to decrease the user data rate for transmission) to transmit first punctured data and depuncturing second punctured data (to increase the channel data rate for reception) to provide second data according to a programmed standard included in the first apparatus and selected from the first plurality of reprogrammable standards at block 649. The method 611 may also include receiving, at the second apparatus, the first punctured data transmitted by the first apparatus at block 651. Finally, the method 611 may include puncturing the second data (to decrease the user data rate for transmission) to transmit the second punctured data and depuncturing the first punctured data (to increase the channel data rate for reception) to provide the first data according to the programmed standard included in the second apparatus and selected from a second plurality of reprogrammable standards (which may also be included in the second apparatus) at block 655.

It should be noted that the methods described herein do not have to be executed in the order described, or in any particular order. Moreover, various activities described with respect to the methods identified herein can be executed in serial or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a computer readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java, Smalltalk, or C++. Alternatively, the programs can be structured in a procedure-orientated format using a procedural language, such as COBOL or C. The software components may communicate using any of a number of mechanisms well-known to those skilled in the art, such as application program interfaces or interprocess communication techniques, including remote procedure calls. The teachings of various embodiments of the present invention are not limited to any particular programming language or environment, including Hypertext Markup Language (HTML) and Extensible Markup Language (XML).

Figure 7:
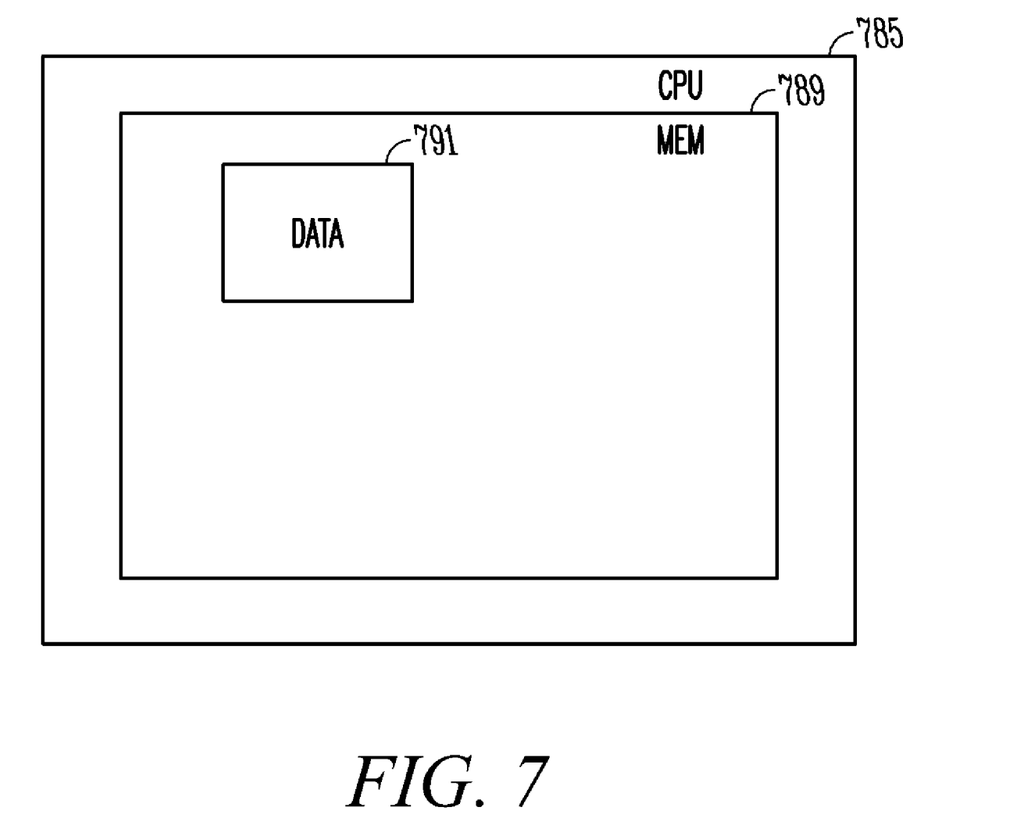
FIG. 7 is a block diagram of an article including a machine-accessible medium according to various embodiments.

FIG. 7 is a block diagram of an article 785 including a machine-accessible medium according to various embodiments. Thus, it can now be seen that another embodiment may include an article 785 such as a computer, a memory system, a magnetic or optical disk, some other storage device, and/or any type of electronic device or system, comprising a machine-accessible medium such as a memory 789 (e.g., a memory including an electrical, optical, or electromagnetic conductor) having associated data 791 (e.g., computer program instructions), which when accessed, results in a machine performing such actions as puncturing first data to transmit first punctured data and depuncturing second punctured data to provide second data according to a programmed standard included in a first apparatus and selected from a first plurality of reprogrammable standards. Other actions may include puncturing the second data to transmit the second punctured data and depuncturing the first punctured data to provide the first data according to the programmed standard included in a second apparatus and selected from a second plurality of reprogrammable standards. Also included may be, for example, the action of receiving, at the second apparatus, the first punctured data transmitted by the first apparatus.

Thus, in various embodiments, apparatus, systems, and methods have been provided that make use of a state machine and/or a look up table to accommodate a variety of standards, including those for which rate matching can be described using a rule or an algorithm. As a part of such apparatus, systems, and methods, reconfigurable logic may allow an array of standards to be housed in a single device, such that the standard in use can be changed as desired, for example, when a wireless device moves from place to place, encountering different types of networks and/or protocols. Thus, many devices, including transmitters, receivers, and transceivers may use combinations of reprogrammable URM and DRM elements to implement rate matching for almost any desired standard, including wireless communication standards. In some embodiments, the DRM and URM can be programmed according to the same scheme, simplifying the design process, and new programs may be downloaded into deployed products housing programmable logic to upgrade performance, support various standards, and reduce the time-to-market.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This detailed description, therefore, is not to be taken in a limiting sense, and the scope of various embodiments is defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments of the invention. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:
1. A method, comprising:
  repeating first data to provide first repeated data and deleting second repeated data to provide second data according to a first programmed standard included in a first apparatus and selected from a first plurality of reprogrammable standards; and receiving a second programmed standard from the first plurality of reprogrammable standards to reprogram the first apparatus to operate in accordance with the second programmed standard;

wherein the first apparatus includes reconfigurable logic having at least one state machine-based rate matcher and at least one table-based rate matcher;

wherein the first programmed standard is a rule-based standard, and wherein the first apparatus uses a state machine when operating under the first programmed standard; and wherein the second programmed standard is a table-based standard, and wherein the first apparatus uses a look up table when operating under the second programmed standard.

2. The method of claim 1, further comprising:

repeating the first data and deleting the second repeated data according to the first programmed standard included in a second plurality of reprogrammable standards included in the first apparatus.

3. The method of claim 1, further comprising:

repeating the second data to provide second repeated data and deleting the first repeated data to provide the first data according to a second programmed standard selected from a second plurality of reprogrammable standards included in a second apparatus.

4. The method of claim 3, further comprising:

reprogramming the second apparatus to operate in accordance with a third plurality of reprogrammable standards including the first programmed standard; and repeating the second data to provide the second repeated data and deleting the first repeated data to provide the first data according to the first programmed standard selected from the third plurality of reprogrammable standards included in the second apparatus.

5. The method of claim 3, further comprising:

transmitting, from the first apparatus, the first data to the second apparatus.

6. An article comprising a machine-readable storage medium having stored data, wherein the data, when accessed, results in a machine performing:

repeating first data to provide first repeated data and deleting second repeated data to provide second data according to a first programmed standard included in a first apparatus and selected from a first plurality of reprogrammable standards; and receiving a second programmed standard from the first plurality of reprogrammable standards to reprogram the first apparatus to operate in accordance with the second programmed standard;

wherein the first apparatus includes reconfigurable logic having at least one state machine-based rate matcher and at least one table-based rate matcher;

wherein the first programmed standard is a rule-based standard, and wherein the first apparatus uses a state machine when operating under the first programmed standard; and wherein the second programmed standard is a table-based standard, and wherein the first apparatus uses a look up table when operating under the second programmed standard.

7. The article of claim 6, wherein the data, when accessed, results in the machine performing:

puncturing the second data to transmit second punctured data and depuncturing first punctured data to provide the first data according to a first programmed standard included in a second apparatus and selected from a second plurality of reprogrammable standards.

8. The article of claim 7, wherein the data, when accessed, results in the machine performing:

receiving, at the second apparatus, the first punctured data transmitted by the first apparatus.

9. A method, comprising:

puncturing first data to transmit first punctured data and depuncturing second punctured data to provide second data according to a first programmed standard included in a first apparatus and selected from a first plurality of reprogrammable standards; and receiving a second programmed standard from the first plurality of reprogrammable standards to reprogram the first apparatus to operate in accordance with the second programmed standard;

wherein the first apparatus includes reconfigurable logic having at least one second programmed standard state machine-based rate matcher and at least one table-based rate matcher;

wherein the first programmed standard is a rule-based standard, and wherein the first apparatus uses a state machine when operating under the first programmed standard; and wherein the second programmed standard is a table-based standard, and wherein the first apparatus uses a look up table when operating under the second programmed standard.

10. The method of claim 9, further comprising:

puncturing the first data and depuncturing the second punctured data according to the second programmed standard included in the first plurality of reprogrammable standards included in the first apparatus.

11. The method of claim 9, further comprising:

puncturing the second data to provide the second punctured data and depuncturing the first punctured data to provide the first data according to a first programmed standard selected from a second plurality of reprogrammable standards included in a second apparatus.

12. The method of claim 11, further comprising:

reprogramming the second apparatus to operate in accordance with a third plurality of reprogrammable standards including the first programmed standard; and puncturing the second data to provide the second punctured data and depuncturing the first punctured data to provide the first data according to the first programmed standard selected from the third plurality of reprogrammable standards included in the second apparatus.

13. The method of claim 11, further comprising:

transmitting, from the first apparatus, the first punctured data to the second apparatus.

14. The method of claim 9, wherein the reconfigurable logic comprises:

a rate matcher pattern generator that operates in a mode selectable between a repeat transmission mode and a depuncture reception mode.

15. The method of claim 9, wherein the reconfigurable logic comprises:

a rate matcher pattern generator that operates in a mode selectable between a delete reception mode and a puncture transmission mode.

* * * * *